US010340170B2

(12) United States Patent
Van Lieshout et al.

(10) Patent No.: US 10,340,170 B2
(45) Date of Patent: Jul. 2, 2019

(54) METHOD AND DEVICE FOR GROOVING WAFERS

(71) Applicant: ASM Technology Singapore Pte Ltd, Singapore (SG)

(72) Inventors: Richard Van Lieshout, Batenburg (NL); Guido Knippels, Schijndel (NL)

(73) Assignee: ASM TECHNOLOGY SINGAPORE PTE LTD, Singapore (SG)

(*) Notice: Subject to any disclaimer, the term of this patent is extended or adjusted under 35 U.S.C. 154(b) by 565 days.

(21) Appl. No.: 15/043,031

(22) Filed: Feb. 12, 2016

(65) Prior Publication Data

US 2017/0236738 A1    Aug. 17, 2017

(51) Int. Cl.
| | | |
|---|---|---|
| *B23K 26/03* | (2006.01) | |
| *H01L 21/68* | (2006.01) | |
| *B23K 26/364* | (2014.01) | |
| *B23K 26/04* | (2014.01) | |
| *B23K 26/402* | (2014.01) | |
| *H01L 21/67* | (2006.01) | |
| *B23K 103/00* | (2006.01) | |

(52) U.S. Cl.
CPC ......... *H01L 21/681* (2013.01); *B23K 26/032* (2013.01); *B23K 26/04* (2013.01); *B23K 26/364* (2015.10); *B23K 26/402* (2013.01); *H01L 21/67092* (2013.01); *H01L 21/67253* (2013.01); *B23K 2103/56* (2018.08)

(58) Field of Classification Search
CPC ............. H01L 21/681; H01L 21/67092; H01L 21/67253; B23K 26/364; B23K 26/032; B23K 26/04; B23K 26/402
See application file for complete search history.

(56) References Cited

U.S. PATENT DOCUMENTS

| | | | | |
|---|---|---|---|---|
| 5,465,154 A | * | 11/1995 | Levy ................. | G01B 11/0616 216/60 |
| 2015/0049171 A1 | * | 2/2015 | Ito .......................... | G01N 27/82 348/46 |

FOREIGN PATENT DOCUMENTS

| | | |
|---|---|---|
| CN | 102139484 | 8/2011 |
| JP | 2014-113604 | 6/2014 |
| KR | 10-2014-0097021 | 8/2014 |
| KR | 10-2014-0143478 | 12/2014 |
| TW | 201538260 | 10/2015 |

* cited by examiner

*Primary Examiner* — Joseph S Del Sole
*Assistant Examiner* — John Robitaille
(74) *Attorney, Agent, or Firm* — Ostrolenk Faber LLP

(57) ABSTRACT

A wafer grooving apparatus (100) for forming an elongate recess (103) in a semiconductor wafer surface, the apparatus comprising:
a wafer table (110) for receiving and holding a semiconductor wafer;
a radiation device (120) for generating a radiation beam (121);
a beam directing device (130) for directing the radiation beam to a top surface (102) of the wafer so as to create a beam spot (142) where the radiation beam ablates wafer material on the wafer surface to form a recess;
a wafer table displacement drive (170) for effecting a mutual displacement between the radiation beam and the wafer surface in a radiation beam displacement direction;
a recess profile measuring device (180) arranged at a predetermined distance behind the beam directing device in the radiation beam displacement direction effected by the wafer table displacement drive for measuring a depth profile of the recess that has been formed by the radiation beam.

17 Claims, 7 Drawing Sheets

METHOD AND DEVICE FOR GROOVING WAFERS

FIELD OF THE INVENTION

The present invention relates in general to the field of semiconductor manufacturing.

BACKGROUND OF THE INVENTION

Miniaturization of electronic components has led to various improvements in semiconductor technology to make electronic components ever-smaller. Such components may include simple components such as diodes, up to complex components such as integrated circuits. Apart from electronic components, mechanical components can also be manufactured using the same technology.

In the art of semiconductor technology, it is commonly known that a wafer of semiconductor material, typically silicon, is processed to form the components in a surface area of the wafer. The wafer is macroscopic, having a diameter ranging in the order of 20-300 mm, while the components are microscopic, typically having a size in the micrometer range. Each component is made in a small wafer portion, with the various wafer portions being located at a small distance from each other. After the processing steps, the wafer is cut to separate the various wafer portions from each other, so that the components become available independent from each other. After separation, each separated wafer portion is referred to as a die, and the separation process is known as dicing. The present invention relates particularly to the field of wafer dicing.

The various wafer portions are typically arranged in a matrix pattern, separated by mutually orthogonal lanes, also indicated as "dicing streets". The separation process involves applying a cut in each dicing street. Evidently, it is desirable that the surface area of the wafer is used as efficiently as possible, therefore said dicing streets are very narrow, which makes the precision requirements for the dicing processing very demanding. Further, along the said orthogonal lanes the top layer is an insulating or low-conductivity semiconductor material, which may be relatively brittle, and a traditional blade dicing method will cause severe damage to this top layer.

To overcome these problems, a hybrid dicing process has already been proposed in the prior art. This process is basically a two-step process, including a first step where radiation, typically a high power laser beam, is used to remove the top layer of the dicing streets, and a second step where a blade is used to cut the bulk silicon. The first step is also indicated as "radiative grooving", or more conveniently as "laser grooving". The present invention relates more particularly to a method of laser grooving.

FIG. 1 is a schematic top view of a portion of a wafer 1, showing component portions 3, wherein areas between the component portions 3 are indicated as dicing streets 4; these areas will be indicated as "dicing streets" in the situation when the grooving process has not been performed yet, but also in the situation when the grooving process has already been performed and the dicing street is hence provided with a groove.

FIG. 2 is a schematic cross section of a portion of the wafer 1, illustrating (on an exaggerated scale) subsequent steps in an exemplary prior art laser grooving process. The top layer of the wafer 1 is indicated at reference numeral 2. In a first step of the laser grooving process (see FIG. 1 righthand side, and FIG. 2 second picture), a relatively low power laser beam 11, 12 is directed to an edge area 13, 14 of a dicing street 4. Arrows indicate the relative movement of the laser beam 11, 12 and dicing street 4 with respect to each other, in a direction parallel to the longitudinal direction of the street 4. Laser power and beam speed are controlled such that the top region of the wafer 1 is removed (ablated) up to a relatively low depth and small width; the resulting elongate recesses at opposite sides of the streets 4 are indicated as "trenches" 15, 16. The depth of the trenches 15, 16 is larger than the thickness of the top layer 2.

In a second step of this exemplary laser grooving process (see FIG. 1 lefthand side, and FIG. 2 lower picture), a relatively high power laser beam 21 is directed to a central area 17 of the dicing street 4. The width of this laser beam 21 covers the entire street width between the trenches 15, 16. The resulting elongate central recess in the centre of the street 4 is indicated here as a "furrow" 18.

The combination of furrow 18 with adjacent trenches 15, 16 will be referred to collectively here as a groove 20. Depending on the precise process parameters, the individual furrow 18 and trenches 15, 16 may or may not be recognizable in the grooves 20. It is noted that FIG. 2 does not aim to provide an exact reproduction of the actual shape of the groove 2; especially along the side edges of the grooves, as material is typically raised above the undisturbed or original top surface of the wafer, forming a dike-like structure indicated as "burr", although this is not shown in FIG. 2. The relative movement between the laser beam and the wafer may be practiced by holding the wafer stationary and moving the laser beam, or by holding the laser beam stationary and moving the wafer, or by moving both. In practice, it is more convenient to hold the optical system stationary and move the wafer; nevertheless, the movement will be indicated as a "scribing" movement of the laser beam with respect to the wafer. Thus, the first step of this exemplary laser grooving process may be referred to as "scribing" trenches, the second step may be referred to as "scribing" a furrow, and the overall process of forming a groove may be referred to as "scribing" a groove.

It is important to achieve a desired ablation profile having a relatively wide furrow with substantially constant depth over a large central part thereof. In practice, the high power laser beam 21 may consist of a matrix of high power laser beams 22, which together effect the material ablation up to the desired depth and width, because such matrix makes it more effective to achieve the desired profile.

Nevertheless, the entire process of scribing a groove involves many process parameters, including scribing speed and beam intensity, which all influence the groove profile achieved. If the groove profile deviates from the desired profile, later dicing steps may not achieve the desired separation and/or may lead to damaging the wafer. For example, if a groove is too shallow, it will still contain too much of the sensitive low-k material which will cause problems on cutting with the dicing blade; if a groove is not wide enough, problems may occur and proper separation may be hampered when the mechanical dicing blade touches the side edges of the groove. It is therefore important to check the quality of the grooves formed in the wafer.

According to the current state of the art, wafer inspection is performed in a separate wafer inspection apparatus. It is to be noted that the grooves typically have a depth in the range of 10 μm and a width in the range of 30-100 μm. For being able to inspect the grooves, an inspection resolution of 1 μm or better is required. This is not possible with a traditional light microscope, in any case not easily. In a typical prior art example, the inspection apparatus comprises a confocal microscope. Confocal microscopy is known to persons skilled in the art, and is not explained here in great detail. Typical for confocal microscopy is a very high optical resolution and contrast in the direction of the optical axis. By scanning the microscope in the direction of the optical axis, which is generally perpendicular to the wafer surface and indicated as Z-direction, there is a well-defined position where the groove bottom is in focus and hence visible. This represents the depth of the groove at that specific measuring position. Although this process gives accurate results, it has a serious drawback in that it is very time-consuming. Not only does scanning in the Z-direction take time before the accurate Z-value is obtained, it is further just one Z-value at one point. For obtaining a cross-profile it is necessary to repeat the measurement at multiple points. The inspection can therefore only be done on test samples, taken at random from the grooving machine. If the resulting grooves in the wafer are not according to specification, it takes a long time before the problem is noted and an operator can take action. By that time many more possibly incorrectly grooved wafers would have been produced which probably have to be discarded. Alternatively, one would have to halt the grooving machine during inspection of a previous wafer before grooving the next wafer, but this results in unacceptable process delays.

SUMMARY OF THE INVENTION

An objective of the present invention is to seek to provide a laser grooving method and apparatus that eliminates or in any case reduces the above drawbacks.

According to the invention, a wafer grooving apparatus for forming an elongate recess in a semiconductor wafer surface comprises a wafer table for receiving and holding a semiconductor wafer; a radiation device for generating a radiation beam; a beam directing device for directing the radiation beam to a top surface of the wafer so as to create a beam spot where the radiation beam ablates wafer material on the wafer surface to form a recess; a wafer table displacement drive for effecting a mutual displacement between the radiation beam and the wafer surface in a radiation beam displacement direction; a recess profile measuring device arranged at a predetermined distance behind the beam directing device in the radiation beam displacement direction effected by the wafer table displacement drive for measuring a depth profile of the recess that has been formed by the radiation beam. The inspection system measures, at a certain measuring distance behind the beam spot, a depth profile of the formed groove, in real time, while the groove is being formed. This would enable an operator to follow the groove forming process more closely, and it even allows a control device to adapt the groove forming process immediately, thus increasing quality and reducing rejects.

In a preferred embodiment, the wafer grooving apparatus further comprises a central processing unit having information defining a desired target recess profile and connected to receive from the recess profile measuring device an output signal defining a measured depth profile, wherein the processor is adapted for comparing the measured depth profile with the target recess profile and to either generate a signal to an operator, or perform an automatic adaptation of process parameters, or both, if the result of the comparison indicates that the measured depth profile deviates from the target recess profile by more than a predefined toleration.

Advantageously, the recess profile measuring device comprises at least one real-time depth measuring device that is adapted to measure a vertical distance to a single measuring spot on the wafer surface. It would be advantageous if the recess profile measuring device comprises a plurality of real-time depth measuring devices each being adapted to measure a vertical distance to a respective single measuring spot on the wafer surface. In such case, the measuring device can be fixed, and possible vibrations in the apparatus would have little influence on the measured profile. The same applies if the recess profile measuring device comprises a line measuring device comprising a linear array of discrete detectors each adapted to measure a vertical distance to a respective single measuring spot on the wafer surface, the detectors being fixedly arranged along a measuring line, preferably with a substantially uniform pitch therebetween.

Advantageously, said measuring spots are located on a virtual line along the wafer surface, which virtual line preferably is a straight line on a plan view of the wafer surface, and wherein said straight line makes an oblique angle α between 0° and 90° with respect to a transverse direction that is substantially transverse to the radiation beam displacement direction. This would enable the full measuring capacity to be used for sensing the full recess width, thus increasing the measuring resolution. Preferably, said angle α is adjustable under control of the central processing unit. It is further preferred that the detectors are arranged along the measuring line with a substantially uniform pitch therebetween.

In another advantageous embodiment, that may comprise multiple depth measuring devices but one single depth measuring device would suffice, the recess profile measuring device comprises an Y-actuator that is controlled by the central processing unit and that is adapted to effect a repetitive displacement of the depth measuring device in a transverse direction that is substantially transverse to the radiation beam displacement direction, or in a direction that has a non-zero component in said transverse direction. The central processing unit may control the Y-actuator such that the measuring device performs an oscillatory movement in said transverse direction or in said direction that has a non-zero component in said transverse direction. It would be advantageous if a direction of the oscillatory movement and/or an amplitude of the oscillatory movement is adjustable under control of the central processing unit.

In a preferred embodiment, the wafer grooving apparatus further comprises a camera for imaging the recess being formed on the wafer surface, and a calibration target having a top surface with an accurately defined and accurately known profile, wherein the wafer grooving apparatus is configured to operate in a calibration mode in which the wafer table is made to align the calibration target with the recess profile measuring device, and wherein the calibration target is observable by the camera such that the measuring signals from the recess profile measuring device are correlatable to the camera image. It is thus possible to determine more accurately the position of the recess with respect to its surroundings, particularly the scribing lanes.

BRIEF DESCRIPTION OF THE DRAWINGS

These and other aspects, features and advantages of the present invention will be further explained by the following description of one or more preferred embodiments with reference to the drawings, in which same reference numerals indicate same or similar parts, and in which.

DETAILED DESCRIPTION OF THE INVENTION

In the above, a groove has been defined as the combination of a furrow with two trenches. It is to be noted that the present invention is not only useful in the grooving process, but is already useful in the process of scribing the trenches. In the following, the wording "linear recess" will be used to indicate a trench, a furrow, a groove or other similar recess which has been ablated by a laser.

Figure 3:
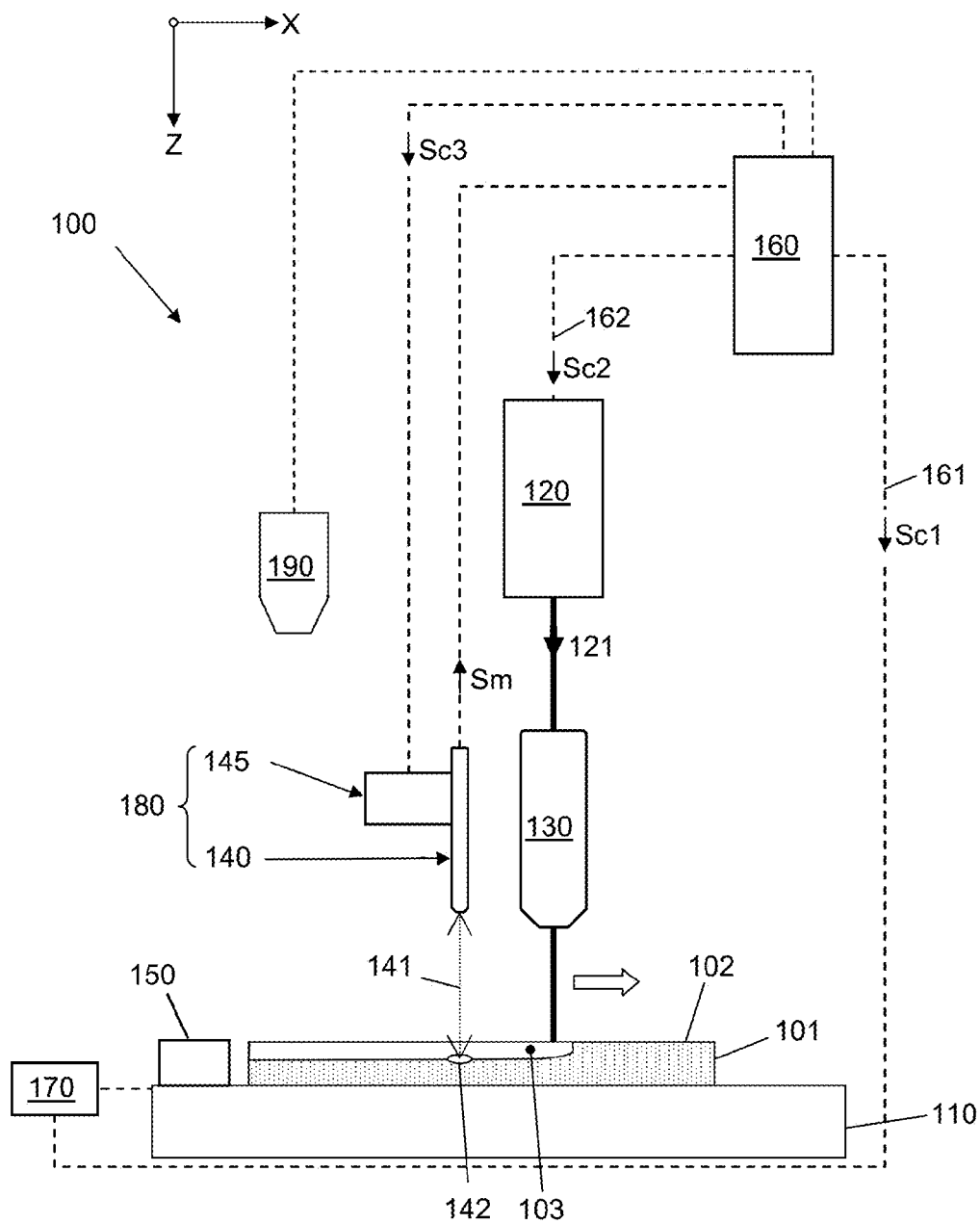
FIG. 3 is a schematic side view of a wafer grooving apparatus according to the present invention.

FIG. 3 is a schematic side view of a wafer grooving apparatus 100 according to the present invention. The wafer grooving apparatus 100 comprises a wafer table 110 that is adapted to receive and hold a wafer 101, and that is adapted to displace the wafer 101 in a direction parallel to its top layer 102. For scribing a linear recess, as will be explained later, the wafer 101 is displaced in a direction along a straight line, which direction will be taken as an X-direction; in FIG. 3, the displacement direction X is from left to right in the plane of drawing.

The wafer grooving apparatus 100 further comprises a radiation device for generating a radiation beam 121. This typically involves a radiation device in the form of an optical laser 120 generating a laser beam 121. For focusing the radiation beam 121 on the wafer top surface 102, the wafer grooving apparatus 100 comprises a lens 130. The optical path between radiation device 120 and lens 130 is shown as a straight line, but may in practice be more complicated as the radiation device 120 may actually be positioned at a more remote location. The lens 130 focuses the radiation beam 121 in a beam spot on the wafer top surface 102, where the focused radiation ablates wafer material, and with the wafer table 110 displacing the wafer 101 in the X-direction, an elongate (typically linear) recess 103 is scribed in the wafer top surface 102, the recess 103 extending in the X-direction. The width direction of the elongate recess 103 will be taken as Y-direction; in FIG. 3, the width direction Y is perpendicular to the plane of drawing. The elongate recess 103 has a depth measured in a Z-direction perpendicular to the wafer top surface 102; in FIG. 3, the depth direction Z is from top to bottom in the plane of drawing.

The wafer grooving apparatus 100 further comprises a groove profile measuring device 180, which comprises a real-time depth measuring device 140. The measuring device 140 is mounted stationary with respect to the lens 130, at a position behind the lens 130 in relation to the scribing direction. The measuring device 140 is adapted to very accurately measure the vertical distance D (in the Z-direction) between a reference position of that measuring device 140 and a measuring spot 142 on the wafer 101. In an example, the measuring device 140 is an optical device, generating a measuring light beam 141 that is directed in the Z-direction; the measuring spot 142 is the spot where the measuring light beam 141 hits a reflective surface on any target below it, i.e. the wafer top surface 102. The positioning of the measuring device 140 is accurately set so that the measuring device 140 is substantially offset with respect to the lens 130 in the X-direction only, so that the measuring spot 142 of the measuring device 140 coincides with the elongate recess 103 that is being scribed.

The design and operation of the measuring device 140 is not essential for understanding and practicing the present invention, as should be clear to a person skilled in the art. Therefore, a detailed description of design and functioning of the measuring device will be omitted here. By way of example, however, it is noted that the measuring device may comprise a chromatic confocal sensor.

The measuring device 140 generates an output measuring signal Sm that represents the measured distance D. The wafer grooving apparatus 100 further comprises a central processing unit 160 that receives the output measuring signal Sm from the measuring device 140, and processes this signal for communicating the measurements results to an operator, for instance by displaying the measured recess depth on a display screen or by generating an alarm signal if the measured recess depth exceeds a predetermined threshold. Alternatively or additionally, the central processing unit 160 may adapt scribing process parameters, for instance the displacement speed of the wafer table 110 or the output power of the laser 120 or focusing conditions of the laser beam by adjusting the lens 130 in the Z-direction, so as to obtain a control feedback loop with the capability for immediate corrective action. For this purpose, FIG. 3 shows an exemplary first signal path 161 for a first control signal Sc1 from the central processing unit 160 to a motor (not shown for sake of simplicity) of a wafer table displacement drive 170, and an exemplary second signal path 162 for a second control signal Sc2 from the central processing unit 160 to the laser 120.

It should be clear to a person skilled in the art that the measuring device 140 provides a measurement of a Z-coordinate of the uppermost point of any feature arranged below the measuring device 140, at the location of the measuring spot. The absolute value of that Z-coordinate will depend on the definition of the reference zero level of the Z-axis; in the following, it is assumed that the reference zero level is positioned at the undisturbed top surface 102 of the wafer 101.

Figure 1:
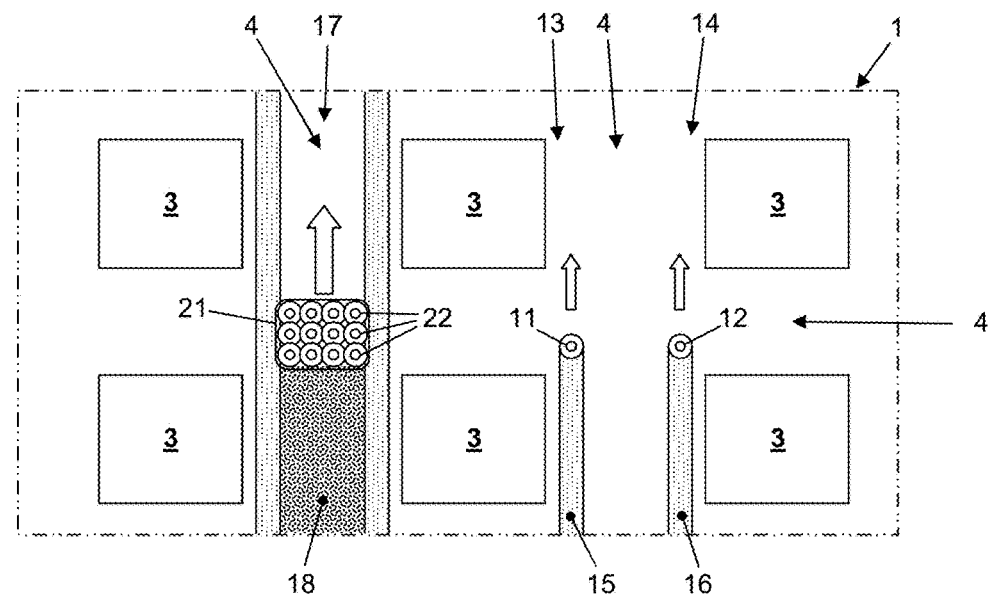
FIG. 1 is a schematic top view of a portion of a wafer.
Figure 2:
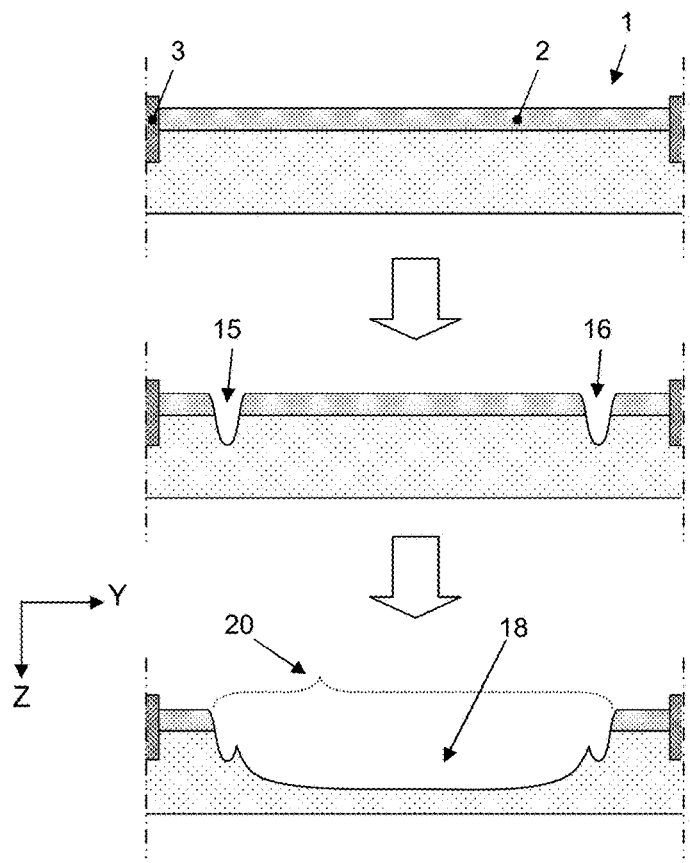
FIG. 2 is a schematic cross section of a portion of the wafer of FIG. 1.
Figure 4:
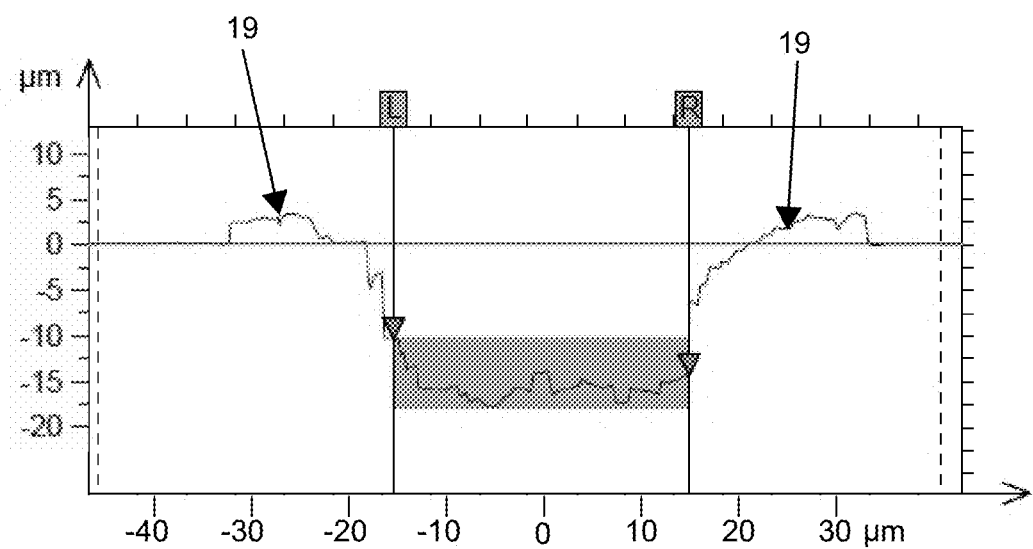
FIG. 4 is a graph showing a measured groove profile.

The lower drawing in FIG. 2 shows a schematic cross section of a groove; the plane of drawing is a YZ plane, and the X-coordinate is perpendicular to the plane of drawing. FIG. 4 is a graph showing a measured groove profile; the groove side walls are marked "L" and "R"; further, the burrs also illustrated, and are indicated at 19. The reference zero of the Y-coordinate is aligned with the centre of the groove. Grooves typically have a width in the range of 30-100 µm. The measuring device 140 described so far will provide the Z-coordinate of one measuring spot 142 only. Typically, such a spot has a diameter of 1 µm-5 µm. In a stationary condition, the measuring signal Sm will indicate the Z-coordinate belonging to one point on the wafer surface 102. During scribing, the measuring spot will travel over the wafer in the X-direction, so that the X-coordinate of the measuring spot can be expressed by the relationship $x(t) = x0 + v \cdot t$, with v indicating the scribing speed. Then, the measuring signal Sm(t) will correspond to the Z-coordinate $z(t)$ belonging to the travelling point $(x(t), y1)$, with y1 indicating a constant value of the Y-coordinate of the measuring spot 142. Thus, as a function of time t, the measuring signal Sm(t) will show the temporal variation of the depth of the groove at one Y-position y1 only, which temporal variation corresponds to depth fluctuations in the X-direction.

While this may already be useful, it is desirable to know the groove profile, i.e. the values of Z as a function of y at one fixed value of x, and it is further desirable to know the variations of this profile in the X-direction. The present invention provides various ways for obtaining or in any case approximating the groove profile.

Figure 5:
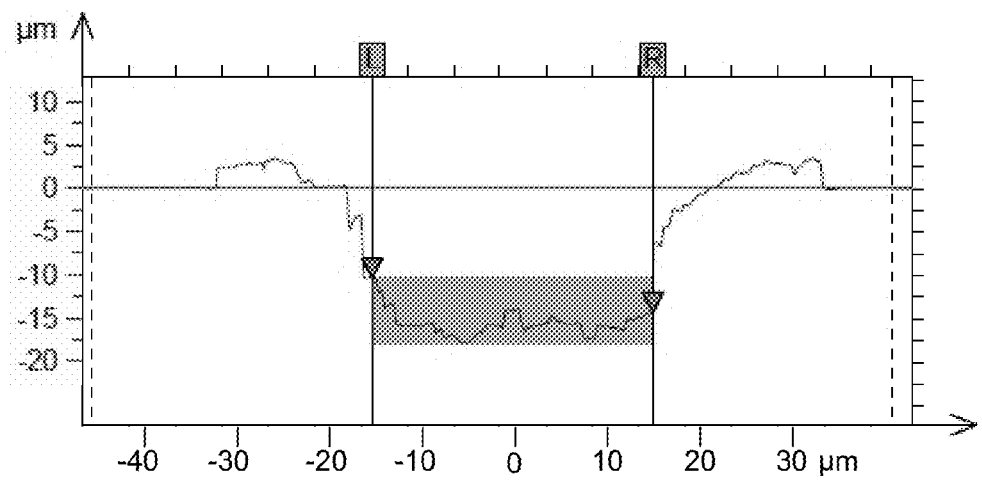
FIG. 5 is a schematic top view of a portion of a groove, showing a linear array of measuring spots of a first embodiment of a groove profile measuring device.
Figure 5:
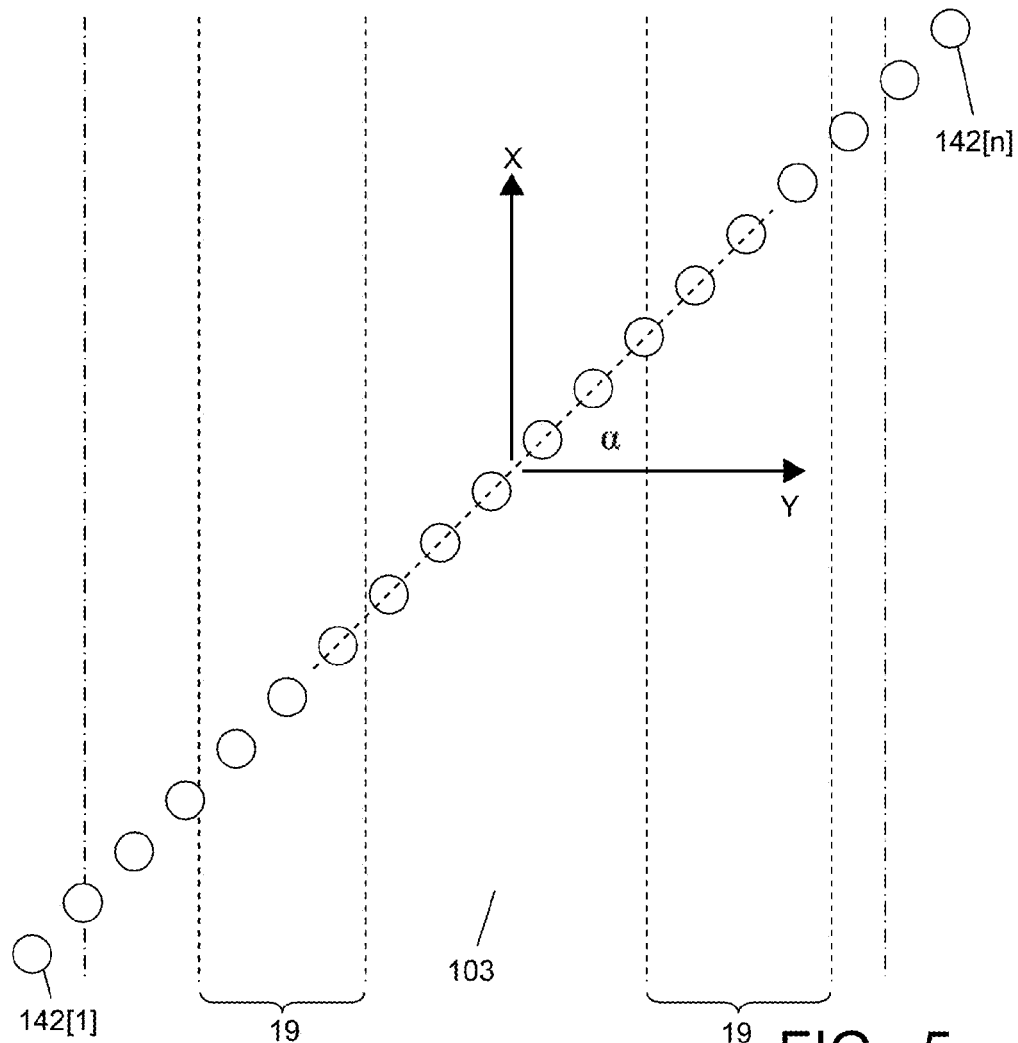

In a first embodiment, the wafer grooving apparatus 100 comprises a plurality of n measuring devices 140[1]-140[n], arranged for respectively measuring the depth at respective, mutually different Y-positions in the groove. It would be ideal if the various measuring devices 140[1]-140[n] are always measuring at the same X-position, but due to the small groove width this is difficult to achieve, if at all possible. This problem is overcome according to the present invention in that the various measuring devices 140[1]-140[n] have their respective measuring spots offset not only in the Y-direction but also in the X-direction. FIG. 5 is a schematic top view of a portion of a groove 103, showing a linear array of measuring spots 142[1]-142[n] projected on the groove. A virtual line connecting the measuring spots 142[1]-142[n] makes an angle α between 0° and 90° with the Y-direction. All measuring signals Sm[1]-Sm[n] are provided to the central processing unit 160, which also has information defining the mutual offsets of the respective measuring spots 142[1]-142[n], so that it is easily possible for the central processing unit 160 to combine the measurements and reconstruct cross-sectional profiles at travelling X-positions X(t). Essentially, this involves respective constant time-shifts for each measuring signal.

Figure 6:
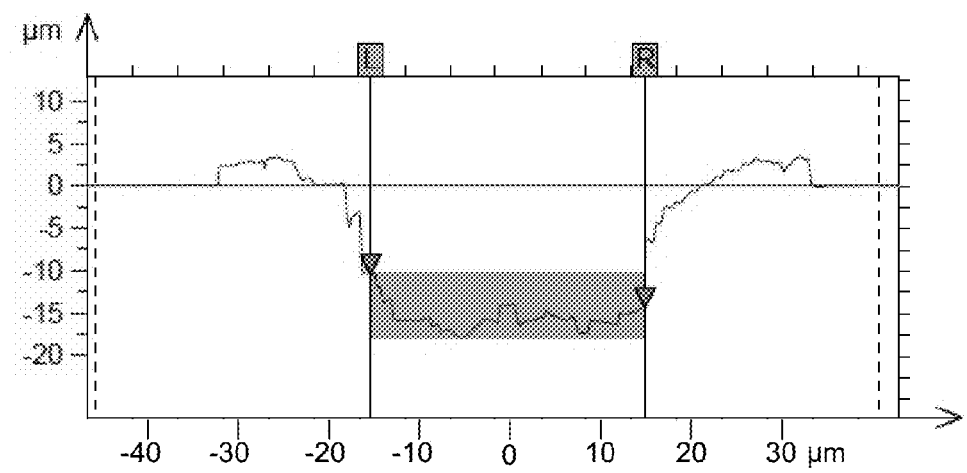
FIG. 6 is a schematic top view of a portion of a groove, showing an oblique measuring line of a second embodiment of a groove profile measuring device.
Figure 6:
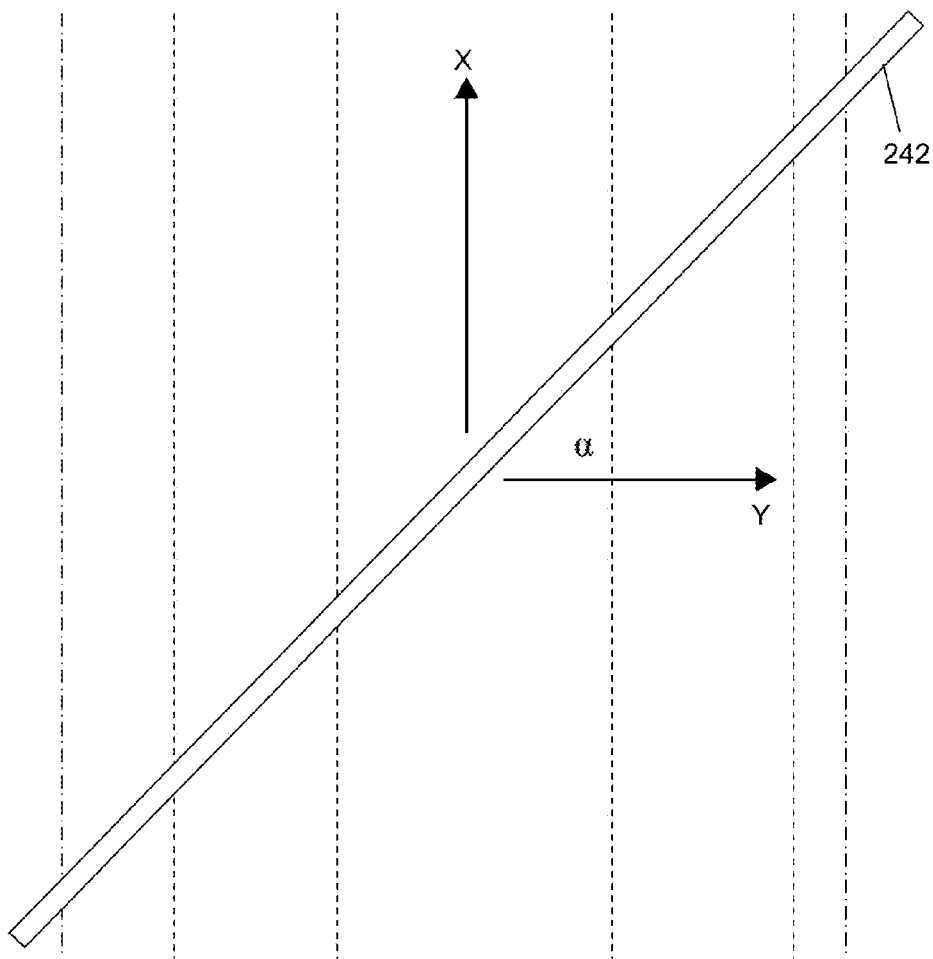

In a second embodiment, use is made of a line measuring device instead of multiple point measuring devices. A line measuring device is comparable to an arrangement of multiple point measuring devices in the sense that the line measuring device contains a plurality of discrete detectors (or sample positions) providing respective output signals, but these detectors are fixedly arranged along a linear measuring line 242 at a very small pitch, typically in the order of 5 μm-10 μm. This result is better than that obtainable with an arrangement of multiple point measuring devices, but may still be too large for effectively and accurately measuring a narrow groove with the required resolution. Further, the length of the line measuring device may be larger than the width of the groove 103 (including the width of the burr 19) to be measured, so that, if the measuring line 242 were to be arranged perpendicular to the longitudinal direction of the groove 103, a large part of the measuring capacity would be wasted. It is therefore preferred that the line measuring device is arranged such that the measuring line 242 that makes an oblique angle α of between 0° and 90° with the Y-direction. FIG. 6 is a schematic top view of a portion of a groove 103, showing an oblique measuring line 242. It will be clear that a larger part of the measuring line 242 coincides with the groove 103 and the measuring resolution in the Y-direction has increased.

In a third embodiment, the measuring device 140 is provided with a Y-actuator 145 (shown in FIG. 3) that is controlled by the central processing unit 160. The Y-actuator 145 is adapted to effect an accurately controlled displacement of the measuring device 140, which displacement has at least a non-zero component in the Y-direction. Similar to the embodiments illustrated in the FIGS. 5 and 6, the direction of said displacement may make an oblique angle α of between 0° and 90° with the Y-direction. However, in contrast to the embodiments illustrated in the FIGS. 5 and 6, where a sensing distance between extreme sensing positions is given by the size of the sensor(s), the sensing distance between extreme sensing positions in the third embodiment can be kept small if the direction of said displacement substantially coincides with the Y-direction, i.e. when said oblique angle α is small or equal to zero. Thus, under control by the central processing unit 160, the measuring device 140 can be swept to scan the Z-profile of the recess in the width-direction of the recess.

The design of the Y-actuator 145 is not an object of the present invention; various known designs can be used in this context. In an exemplary embodiment, the Y-actuator 145 may comprise a piezo crystal. In another exemplary embodiment, the Y-actuator 145 may comprise a voice coil.

Figure 7:
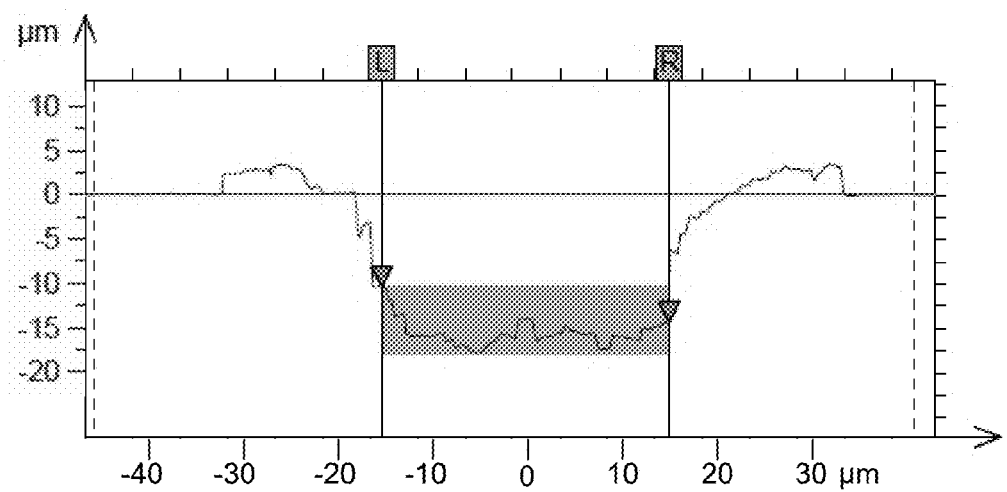
FIG. 7 is a schematic top view of a portion of a groove, showing a triangular path that is travelled by the single measuring spot of a third embodiment of a groove profile measuring device.
Figure 7:
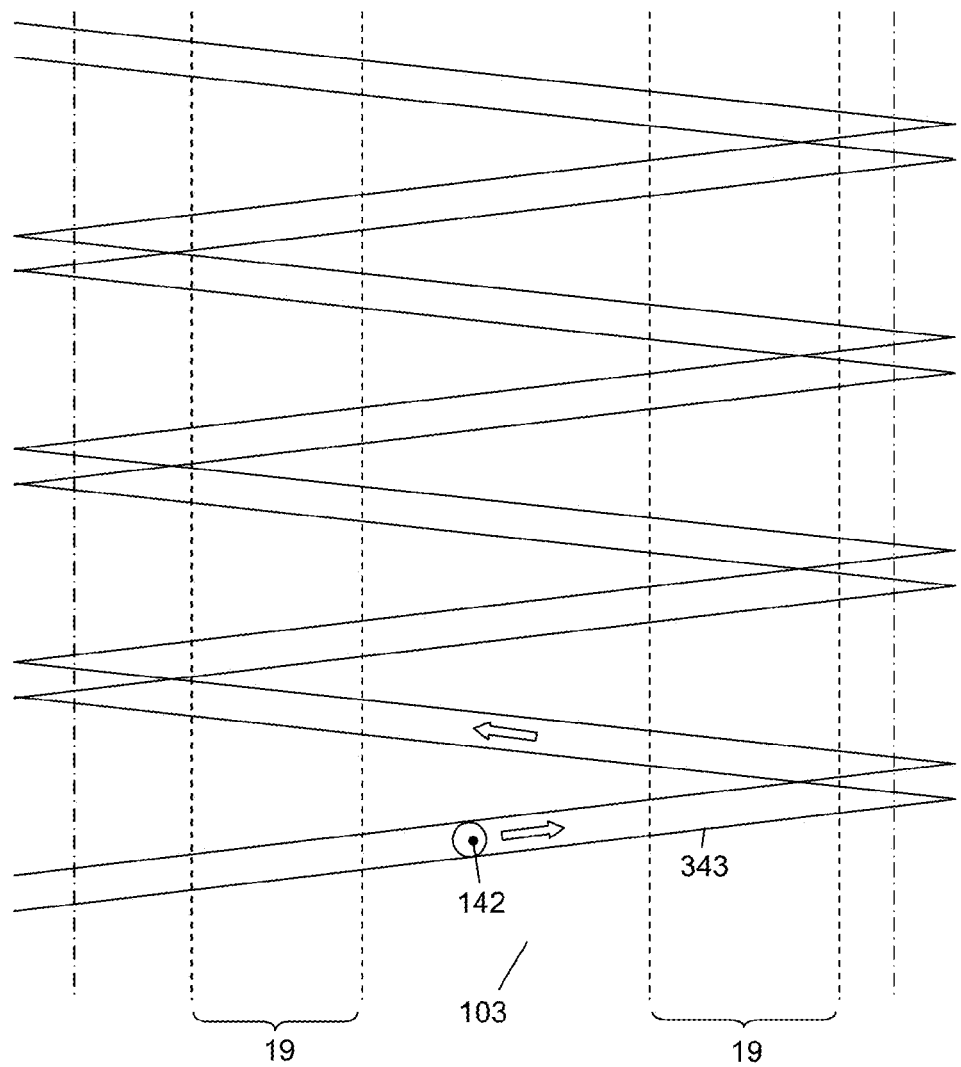

The central processing unit 160 is adapted to generate a control signal Sc3 for controlling the Y-actuator 145 such that the measuring device 140 performs an oscillation movement in a direction substantially transverse to the radiation beam displacement direction. Considering the linear travel in the X-direction, the actual path followed by the measuring spot 142 is not critical; this path may for instance be sawtooth, triangular or sine-shaped. In any case, the amplitude of the oscillation movement will be selected to be large enough to in any case cover the two burrs 19 and some portion of undisturbed wafer surface 102, because the size and shape of the burrs are also important quality parameters. FIG. 7 is a schematic top view of a portion of a groove 103, showing an exemplary triangular path 343 that is travelled by the single measuring spot 142.

It should be clear that the output measuring signal Sm(t) from the measuring device 140, as a function of time, will correspond to the Z-coordinate z(t) belonging to the travelling point (x(t),y(t)). At all times, the central processing unit 160 knows the value of y(t) since it is the central processing unit 160 that determines the Y-position of the measuring device 140. The oscillation frequency is set to be sufficiently fast, so that it may be assumed that during one oscillation period, or shorter during a series of at least 10 oscillation periods, the variation of the recess profile in the X-direction may be neglected. In such case, the temporal variation of z(t) fully correlates to the temporal variation of y(t), and hence the profile in the Y-direction can be accurately calculated. It is possible to consider the profile per oscillation period, or to obtain an average of the same over two or more oscillation periods.

An advantage of the oscillating embodiment is that it is possible to obtain higher measuring resolution in the Y-direction. In the case of multi-point measuring, each measuring device outputs a continuous measuring signal that reflects the depth variation in the X-direction at high positional resolution, but this variation will be small or negligible. In the Y-direction, however, the resolution will inevitably be determined by the number of measuring points, and for the required high accuracy the number of measuring points needs to be high, which in the case of multiple point sensors increases costs and increases the space occupied by the measuring equipment.

A further advantage is that it is possible, by selecting a special shape of the oscillation movement and consequently a special shape of the scan path followed by the measuring spot, to selectively increase the measuring resolution in selected parts of the groove.

On the other hand, the oscillating embodiment is likely to be more sensitive to possible vibrations in the apparatus. In the case of the multipoint embodiments, be it multiple point sensors or a line sensor, any vibrations that cause displacements of the depth sensor will likely result in a relative displacement of all measuring points at the same time, so that the measured profile of the groove is hardly or not affected.

The above-mentioned angle α may be fixed. However, in a preferred embodiment an actuator controlled by the central processing unit 160 may be provided for adjusting the said angle. This allows the processing unit 160 to optimize said angle depending on the groove parameters, particularly the width of the groove plus the widths of the burrs. Likewise, in the third embodiment, the amplitude of the oscillation movement may be fixed or may be adjustable by the central processing unit 160.

Figure 8:
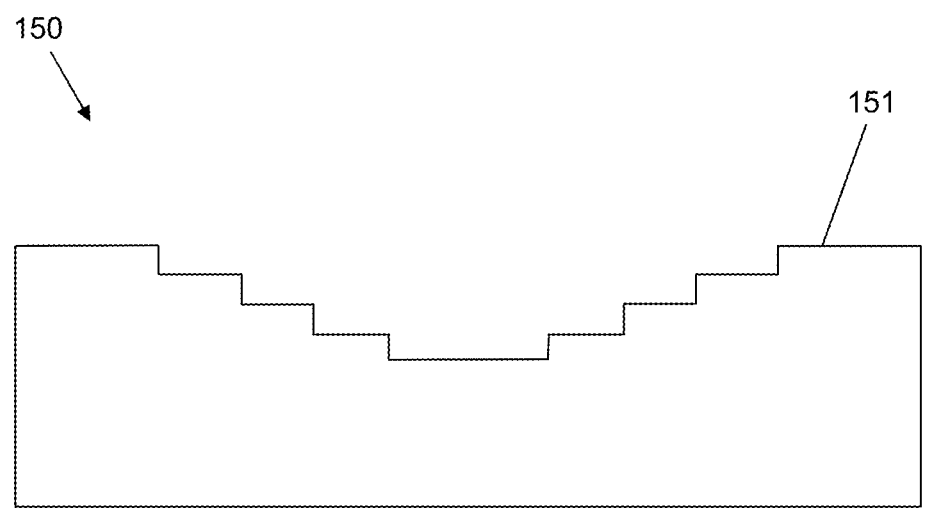
FIG. 8 schematically illustrates a possible embodiment of a calibration target.

In the above, it has been explained that it is possible to obtain real time accurate information regarding the profile of the recess 103 being scribed. It may however be that the precise Y-position of the recess 103 as a whole is not precisely known. It is important to know the Y-position of the recess 103 as a whole, especially with respect to the edges of the scribing lanes. It is possible to observe the recess 103 with a camera, schematically indicated at reference numeral 190 in FIG. 3, in relation to the edges of the scribing lanes and/or the semiconductor components 3 on the wafer 101. However, in the case of a well-functioning scribing process with sharp groove edges and a flat groove bottom, the contrast between groove and undisturbed wafer surface is low and the groove is difficult to recognize. To overcome this problem, the present invention proposes a calibration target 150 mounted on the wafer table 110. The calibration target 150 has a top surface 151 with an accurately defined and accurately known profile, for instance a step profile as schematically illustrated in FIG. 8. In a calibration mode, the wafer table 110 is made to align the calibration target 150 with the measuring device 140, and then to make a scanning movement in the Y-direction, so that the measuring device 140 scans the top surface 151 of the calibration target 150; the measuring signals now generated by the measuring device 140 can be correlated to the known top surface 151 profile. The calibration target 150 is also observed by the camera 190. It is now possible to correlate the measuring signals from the measuring device 140 to the camera image, in other words to perform an X-calibration and a Y-calibration.

It should be clear to a person skilled in the art that the present invention is not limited to the exemplary embodiments discussed above, but that several variations and modifications are possible within the protective scope of the invention as defined in the appended claims. Even if certain features are recited in different dependent claims, the present invention also relates to an embodiment comprising these features in common. Even if certain features have been described in combination with each other, the present invention also relates to an embodiment in which one or more of these features are omitted. Features which have not been explicitly described as being essential may also be omitted. Any reference signs in a claim should not be construed as limiting the scope of that claim.

The invention claimed is:

1. A wafer grooving apparatus for forming an elongate recess in a semiconductor wafer surface, the apparatus comprising:
    a wafer table for receiving and holding a semiconductor wafer;
    a radiation device for generating a radiation beam;
    a beam directing device for directing the radiation beam to a top surface of the wafer so as to create a beam spot where the radiation beam ablates wafer material on the wafer surface to form a recess;
    a wafer table displacement drive for effecting a mutual displacement between the radiation beam and the wafer surface in a radiation beam displacement direction;
    a recess profile measuring device arranged at a predetermined distance behind the beam directing device in the radiation beam displacement direction effected by the wafer table displacement drive for measuring a depth profile of the recess that has been formed by the radiation beam,
    wherein the recess profile measuring device comprises at least one real-time depth measuring device configured and positioned relative to the beam directing device to coincide with the recess in the radiation beam displacement direction to measure a vertical distance to a single measuring spot in the recess while the recess is being formed, and
    wherein the recess profile measuring device comprises a plurality of real-time depth measuring devices,
    wherein each real-time depth measuring device is configured to measure a vertical distance to a respective single measuring spot on the wafer surface.

2. The wafer grooving apparatus according to claim 1, further comprising:
    a central processing unit-having information defining a desired target recess profile and connected to receive from the recess profile measuring device an output signal defining a measured depth profile,
    wherein the processing unit is adapted for comparing the measured depth profile with the target recess profile and to either generate a signal to an operator, or perform an automatic adaptation of process parameters, or both, when the result of the comparison indicates that the measured depth profile deviates from the target recess profile by more than a predefined toleration.

3. The wafer grooving apparatus according to claim 1, wherein the said measuring spots are located on a virtual line along the wafer surface.

4. The wafer grooving apparatus according to claim 3, wherein said virtual line is a straight line on a plan view of the wafer surface, and
    wherein said straight line makes an oblique angle between 0° and 90° with respect to a transverse direction that is substantially transverse to the radiation beam displacement direction.

5. The wafer grooving apparatus according to claim 4, wherein said oblique angle α is adjustable under control of a central processing unit.

6. A wafer grooving apparatus for forming an elongate recess in a semiconductor wafer surface, the apparatus comprising:
    a wafer table for receiving and holding a semiconductor wafer;
    a radiation device for generating a radiation beam;
    a beam directing device for directing the radiation beam to a top surface of the wafer so as to create a beam spot where the radiation beam ablates wafer material on the wafer surface to form a recess;
    a wafer table displacement drive for effecting a mutual displacement between the radiation beam and the wafer surface in a radiation beam displacement direction;
    a recess profile measuring device arranged at a predetermined distance behind the beam directing device in the radiation beam displacement direction effected by the wafer table displacement drive for measuring a depth profile of the recess that has been formed by the radiation beam,
wherein the recess profile measuring device comprises at least one real-time depth measuring device configured and positioned relative to the beam directing device to coincide with the recess in the radiation beam displacement direction to measure a vertical distance to a single measuring spot in the recess while the recess is being formed,
wherein the recess profile measuring device comprises a line measuring device comprising a linear array of discrete detectors,
wherein each detector is fixedly positioned along a measuring line and is configured to measure a vertical distance to a respective single measuring spot on the wafer surface.

7. The wafer grooving apparatus according to claim 6, wherein the detectors are arranged along the measuring line with a substantially uniform pitch therebetween.

8. The wafer grooving apparatus according to claim 6, wherein said measuring line makes an oblique angle α of between 0° and 90° with respect to a transverse direction that is substantially transverse to the radiation beam displacement direction.

9. The wafer grooving apparatus according to claim 8, wherein said oblique angle α is adjustable under control of a central processing unit.

10. A wafer grooving apparatus for forming an elongate recess in a semiconductor wafer surface, the apparatus comprising:
a wafer table for receiving and holding a semiconductor wafer;
a radiation device for generating a radiation beam;
a beam directing device for directing the radiation beam to a top surface of the wafer so as to create a beam spot where the radiation beam ablates wafer material on the wafer surface to form a recess;
a wafer table displacement drive for effecting a mutual displacement between the radiation beam and the wafer surface in a radiation beam displacement direction;
a recess profile measuring device arranged at a predetermined distance behind the beam directing device in the radiation beam displacement direction effected by the wafer table displacement drive for measuring a depth profile of the recess that has been formed by the radiation beam,
wherein the recess profile measuring device comprises at least one real-time depth measuring device configured and positioned relative to the beam directing device to coincide with the recess in the radiation beam displacement direction to measure a vertical distance to a single measuring spot in the recess while the recess is being formed
wherein the recess profile measuring device comprises a Y-actuator that is controlled by a central processing unit and that is adapted to effect a repetitive displacement of the depth measuring device in a transverse direction that is substantially transverse to the radiation beam displacement direction, or in a direction that has a non-zero component in said transverse direction.

11. The wafer grooving apparatus according to claim 10, wherein a central processing unit is adapted to generate a control signal for controlling the Y-actuator such that the measuring device performs an oscillatory movement in said transverse direction or in said direction that has a non-zero component in said transverse direction.

12. The wafer grooving apparatus according to claim 11, wherein at least one of a direction of the oscillatory movement and an amplitude of the oscillatory movement is adjustable under control of a central processing unit.

13. The wafer grooving apparatus according to claim 1, further comprising:
a camera for imaging the recess being formed on the wafer surface, and a calibration target having a top surface with an accurately defined and accurately known profile;
wherein the wafer grooving apparatus is configured to operate in a calibration mode in which the wafer table is made to align the calibration target with the recess profile measuring device, and
wherein the calibration target is observable by the camera such that the measuring signals from the recess profile measuring device are correlatable to the camera image.

14. The wafer grooving apparatus according to claim 6, further comprising:
a central processing unit having information defining a desired target recess profile and connected to receive from the recess profile measuring device an output signal defining a measured depth profile,
wherein the processing unit is configured to compare, when the result of the comparison indicates that the measured depth profile deviates from the target recess profile by more than a predefined toleration, the measured depth profile with the target recess profile, and the processing unit is configured, at least one of: (i) to generate a signal to an operator, and (ii) to perform an automatic adaptation of process parameters.

15. The wafer grooving apparatus according to claim 10, further comprising:
a central processing unit having information defining a desired target recess profile and connected to receive from the recess profile measuring device an output signal defining a measured depth profile,
wherein the processing unit is configured to compare, when the result of the comparison indicates that the measured depth profile deviates from the target recess profile by more than a predefined toleration, the measured depth profile with the target recess profile, and the processing unit is configured, at least one of: (i) to generate a signal to an operator, and (ii) to perform an automatic adaptation of process parameters.

16. The wafer grooving apparatus according to claim 6, further comprising:
a camera configured to image the recess being formed on the wafer surface, and a calibration target having a top surface with an accurately defined and accurately known profile;
wherein the wafer grooving apparatus is configured to operate in a calibration mode in which the wafer table is made to align the calibration target with the recess profile measuring device, and
wherein the calibration target is observable by the camera such that the measuring signals from the recess profile measuring device are correlatable to the camera image.

17. The wafer grooving apparatus according to claim 10, further comprising:
a camera configured to image the recess being formed on the wafer surface, and a calibration target having a top surface with an accurately defined and accurately known profile;
wherein the wafer grooving apparatus is configured to operate in a calibration mode in which the wafer table is made to align the calibration target with the recess profile measuring device, and wherein the calibration target is observable by the camera such that the measuring signals from the recess profile measuring device are correlatable to the camera image.

* * * * *